(12) United States Patent
Kim

(10) Patent No.: US 12,130,338 B2
(45) Date of Patent: Oct. 29, 2024

(54) BATTERY ABNORMALITY DIAGNOSIS APPARATUS AND METHOD

(71) Applicant: LG ENERGY SOLUTION, LTD., Seoul (KR)

(72) Inventor: Young Jin Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 109 days.

(21) Appl. No.: 17/925,526

(22) PCT Filed: Aug. 9, 2021

(86) PCT No.: PCT/KR2021/010474
§ 371 (c)(1),
(2) Date: Nov. 15, 2022

(87) PCT Pub. No.: WO2022/035151
PCT Pub. Date: Feb. 17, 2022

(65) Prior Publication Data
US 2023/0194622 A1 Jun. 22, 2023

(30) Foreign Application Priority Data
Aug. 10, 2020 (KR) .................. 10-2020-0100130

(51) Int. Cl.
G01R 31/396 (2019.01)
G01R 31/3842 (2019.01)
H02J 7/00 (2006.01)

(52) U.S. Cl.
CPC ....... *G01R 31/396* (2019.01); *G01R 31/3842* (2019.01); *H02J 7/0047* (2013.01)

(58) Field of Classification Search
None
See application file for complete search history.

(56) References Cited

U.S. PATENT DOCUMENTS

| 2010/0224157 A1 | 9/2010 | Mizuno |
| 2012/0035872 A1* | 2/2012 | Fink ............... H02J 7/0047 702/63 |
| 2012/0158330 A1 | 6/2012 | Araki |
| 2012/0169288 A1 | 7/2012 | Ueki et al. |
| 2013/0314050 A1 | 11/2013 | Matsubara et al. |
| 2013/0335009 A1 | 12/2013 | Katsumata et al. |

(Continued)

FOREIGN PATENT DOCUMENTS

| CN | 103698714 A | 4/2014 |
| EP | 3579311 A1 | 12/2019 |

(Continued)

OTHER PUBLICATIONS

International Search Report (PCT/ISA/210) issued in PCT/KR2021/010474, dated Nov. 22, 2021.

*Primary Examiner* — Jas A Sanghera
(74) *Attorney, Agent, or Firm* — Birch, Stewart, Kolasch & Birch, LLP

(57) ABSTRACT

A battery abnormality diagnosis apparatus including a sensing unit measuring a voltage and a current of a battery cell, a differential data calculating unit calculating differential data for a capacity and a voltage of the battery cell, and an abnormality diagnosing unit diagnosing abnormality of the battery cell based on the differential data and classifying a type of the abnormality.

12 Claims, 8 Drawing Sheets

(56) References Cited

U.S. PATENT DOCUMENTS

| | | | |
|---|---|---|---|
| 2016/0116547 A1 | 4/2016 | Hanyu et al. | |
| 2016/0195589 A1 | 7/2016 | Hanyu et al. | |
| 2016/0254687 A1 | 9/2016 | Tanaka et al. | |
| 2017/0160349 A1 | 6/2017 | Iida et al. | |
| 2018/0131200 A1* | 5/2018 | Crawford | H02J 7/00036 |
| 2019/0113577 A1 | 4/2019 | Severson et al. | |
| 2020/0278399 A1* | 9/2020 | Zhang | G07C 5/0825 |
| 2020/0393518 A1 | 12/2020 | Takegami et al. | |
| 2021/0046844 A1 | 2/2021 | Bae et al. | |
| 2021/0336260 A1 | 10/2021 | Toyama et al. | |
| 2021/0336299 A1 | 10/2021 | Matthey et al. | |
| 2022/0276319 A1 | 9/2022 | Kim | |
| 2022/0342003 A1* | 10/2022 | Pilipili Matady | H01M 10/44 |

FOREIGN PATENT DOCUMENTS

| | | |
|---|---|---|
| EP | 4038399 A1 | 8/2022 |
| JP | 2010-230654 A | 10/2010 |
| JP | WO2011/007805 A1 | 12/2012 |
| JP | 5287872 B2 | 9/2013 |
| JP | 2013-247003 A | 12/2013 |
| JP | 5662968 B2 | 2/2015 |
| JP | 2015-60761 A | 3/2015 |
| JP | 2016-14606 A | 1/2016 |
| JP | 2016-126891 A | 7/2016 |
| JP | 2017-133870 A | 8/2017 |
| JP | 6192738 B2 | 9/2017 |
| JP | 2018-147635 A | 9/2018 |
| JP | 6455313 B2 | 1/2019 |
| JP | 6485041 B2 | 3/2019 |
| JP | 6488105 B2 | 3/2019 |
| JP | 6500789 B2 | 4/2019 |
| JP | 2019-96552 A | 6/2019 |
| JP | 2019-158597 A | 9/2019 |
| JP | 2019-184581 A | 10/2019 |
| JP | 6607167 B2 | 11/2019 |
| JP | 2020-22226 A | 2/2020 |
| JP | 7384529 B2 | 11/2023 |
| KR | 10-2013-0142884 A | 12/2013 |
| KR | 10-2019-0118529 A | 10/2019 |
| WO | WO 2011/036760 A1 | 3/2011 |

* cited by examiner

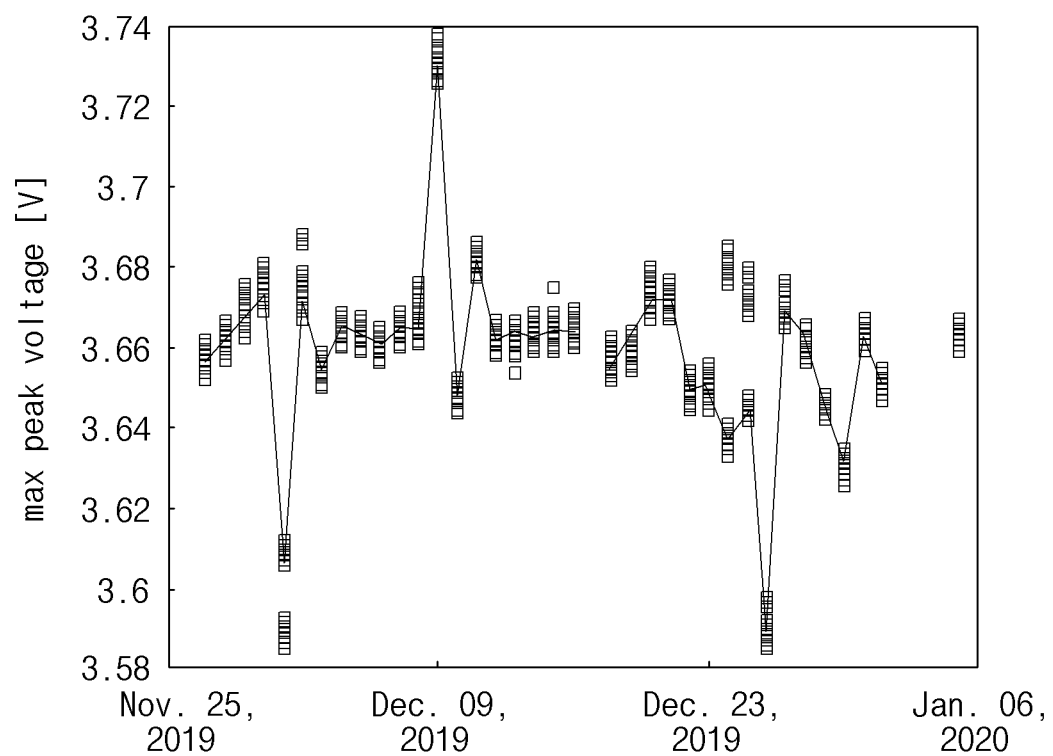
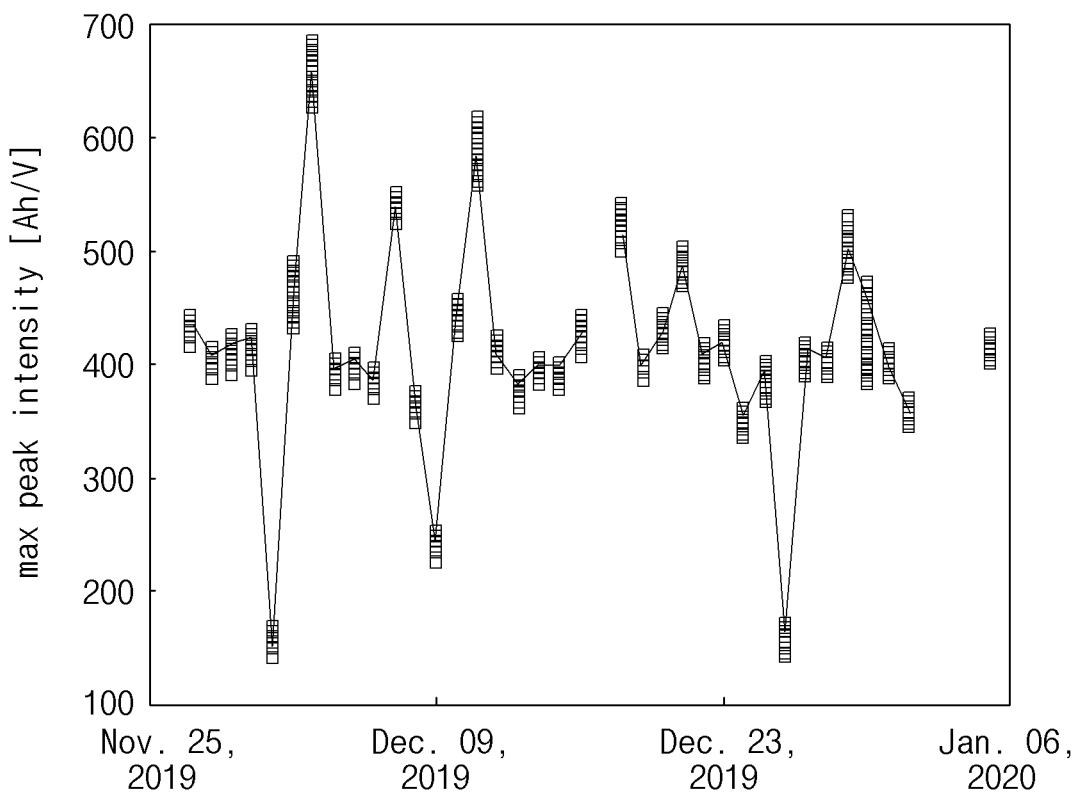
F I G. 4A

BATTERY ABNORMALITY DIAGNOSIS APPARATUS AND METHOD

CROSS-REFERENCE TO RELATED APPLICATION

This application claims priority to and the benefit of Korean Patent Application No. 10-2020-0100130 filed in the Korean Intellectual Property Office on Aug. 10, 2020, the entire contents of which are incorporated herein by reference.

TECHNICAL FIELD

The present invention relates to a battery abnormality diagnosis apparatus and method for diagnosing an abnormal behavior of a battery by using a differential curve for a capacity-voltage of the battery and classifying an abnormality type.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium ion batteries. Among the secondary batteries, a lithium ion battery has a much higher energy density than those of the conventional Ni/Cd batteries, Ni/MH batteries, etc. Moreover, the lithium ion battery may be manufactured to be small and lightweight, such that the lithium ion battery has been used as a power source of mobile devices. In addition, the lithium ion battery is attracting attention as a next-generation energy storage medium as a usage range thereof is expanded to a power source of electric vehicles.

Furthermore, the secondary battery is generally used as a battery pack including a battery module where a plurality of battery cells are connected to one another in series and/or in parallel. The battery pack may be managed and controlled by a battery management system in terms of a state and an operation.

When such a secondary battery is continuously used, a degradation phenomenon may occur in which an available capacity of the battery gradually decreases. Conventionally, detection of an unstable behavior of measurement data has been detected to detect degradation of the battery, but there is no way to detect degradation when the battery operates normally. Moreover, conventionally, degradation of the battery is merely detected, but a detailed type of degradation is difficult to identify.

DISCLOSURE

Technical Problem

The present invention has been designed to solve the foregoing problems and aims to provide a battery abnormality diagnosis apparatus and method in which by analyzing differential data for a capacity and a voltage of a battery, an abnormal behavior of the battery is diagnosed and an abnormality type is classified.

Technical Solution

A battery abnormality diagnosis apparatus according to an embodiment of the present invention includes a sensing unit measuring a voltage and a current of a battery cell, a differential data calculating unit calculating differential data for a capacity and the voltage of the battery cell, and an abnormality diagnosing unit diagnosing abnormality of the battery cell based on the differential data and classifying a type of the abnormality.

A battery abnormality diagnosis method according to an embodiment of the present invention includes measuring a voltage and a current of a battery cell, calculating differential data for a capacity and the voltage of the battery cell, and diagnosing abnormality of the battery cell based on the differential data and classifying a type of the abnormality.

Advantageous Effects

According to the battery abnormality diagnosis apparatus and method of the present invention, by analyzing differential data for a capacity and a voltage of a battery, an abnormal behavior of the battery may be diagnosed and an abnormality type may be classified.

DESCRIPTION OF DRAWINGS

FIG. 4A is a view showing maximum peak voltage and peak intensity calculated by a battery abnormality diagnosis apparatus according to an embodiment of the present invention.

MODE FOR INVENTION

Figure 1:
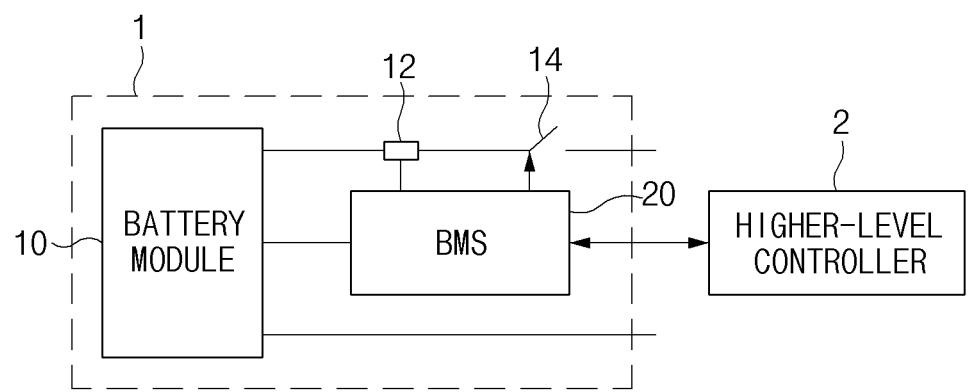
FIG. 1 is a block diagram of a general battery Rack.

Hereinafter, various embodiments of the present invention will be described in detail with reference to the accompanying drawings. In this document, identical reference numerals will be used for identical components in the drawings, and the identical components will not be redundantly described.

For various embodiments of the present invention disclosed in this document, specific structural or functional descriptions are only exemplified for the purpose of describing the embodiments of the present invention, and various embodiments of the present invention may be implemented in various forms, and should not be construed as being limited to the embodiments described in this document.

As used in various embodiments, the terms "1st, "2nd", "first", "second", or the like may modify various components regardless of order and/or importance, and do not limit the components. For example, a first component may be named as a second component without departing from the right scope of the present disclosure, and similarly, the second component may be named as the first component.

Terms used in the present document are used for only describing a specific exemplary embodiment of the disclosure and may not have an intention to limit the scope of other exemplary embodiments of the disclosure. It is to be understood that the singular expressions include plural expressions unless the context clearly dictates otherwise.

All of the terms used herein including technical or scientific terms have the same meanings as those generally understood by an ordinary skilled person in the related art. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

FIG. 1 is a block diagram of a general battery rack.

Referring to FIG. 1, a battery control system including a battery rack 1 and a higher-level controller 2 included in a higher-level system according to an embodiment of the present invention is schematically shown.

As shown in FIG. 1, the battery rack 1 may include a battery module 10 that includes one or more battery cells and is chargeable/dischargeable, a switching unit 14 serially connected to a positive (+) terminal side or a negative (−) terminal side of the battery module 10 to control a charging/discharging current flow of the battery module 10, and a battery management system (e.g., MBMS) 20 for control and management to prevent over-charging and over-discharging by monitoring voltage, current, temperature, etc., of the battery rack 1. The battery rack 1 may include a plurality of battery modules 10, sensors 12, switching units 14, and battery management systems 20.

Herein, as the switching unit 14 which is a semiconductor switching element for controlling a current flow for charging or discharging of the plurality of battery modules 10, for example, at least one Metal Oxide Semiconductor Field Effect Transistor (MOSFET), relay, magnetic contactor, etc., may be used according to specifications of the battery rack 1.

The battery management system 20 may measure or calculate voltage and current of a gate, a source, a drain, etc., of the semiconductor switching element to monitor voltage, current, temperature, etc., of the battery rack 1. The battery management system 20 may measure current, voltage, temperature, etc., of the battery rack 1 by using a sensor 12 provided adjacent to the semiconductor switching element. Herein, the sensor 12 may correspond to a sensing unit of FIG. 2 described below.

The battery management system 20, which is an interface for receiving measurement values of the above-described various parameters, may include a plurality of terminals and a circuit, etc., connected thereto to process input values. The battery management system 20 may control ON/OFF of the switching unit 14, e.g., the MOSFET, and may be connected to the battery module 10 to monitor a state of each battery module 10.

Meanwhile, the battery management system 20 according to the present invention may calculate differential data for a capacity and a voltage of a battery cell through a separate program, as will be described below. Abnormality of the battery cell may be diagnosed using calculated differential data.

The higher-level controller 2 may transmit a control signal for the battery module 10 to the battery management system 20. Thus, the battery management system 20 may also be controlled in terms of an operation thereof based on a signal applied from the higher-level controller 2. Meanwhile, the battery cell according to the present invention may be included in the battery module 10 used for an energy storage system (ESS). In this case, the higher-level controller 2 may be an ESS controller. However, the battery rack 1 is not limited to such a purpose.

Such configurations of the battery rack 1 and the battery management system 20 are well-known configurations, and thus will not be described in detail.

Figure 2:
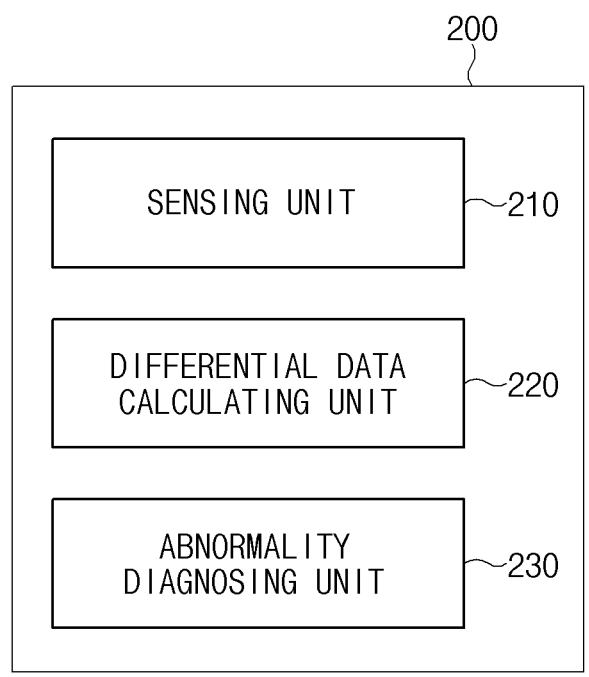
FIG. 2 is a block diagram showing a structure of a battery abnormality diagnosis apparatus according to an embodiment of the present invention.

FIG. 2 is a block diagram showing a structure of a battery abnormality diagnosis apparatus according to an embodiment of the present invention.

Referring to FIG. 2, a battery abnormality diagnosis apparatus 200 according to an embodiment of the present invention may include a sensing unit 210, a differential data calculating unit 220, and an abnormality diagnosing unit 230.

The sensing unit 210 may measure a voltage and a current of the battery cell. The sensing unit 210 may measure the voltage and the current of the battery cell at specific time intervals.

The differential data calculating unit 220 may calculate differential data for the capacity and the voltage of the battery cell. For example, the differential data calculating unit 220 may calculate a differential curve dQ/dV for the capacity and the voltage of the battery cell.

In this case, the differential data calculating unit 220 may calculate differential data when a data value measured or calculated for the battery cell satisfies a preset condition. For example, the differential data calculating unit 220 may calculate differential data for the capacity and the voltage of the battery cell when a charging current change or a discharging current change of the battery cell for a specific time is greater than a reference value. Moreover, the differential data calculating unit 220 may calculate differential data for the capacity and the voltage of the battery cell when an State Of Charge (SOC) change for a specific time after end of charging/discharging of the battery cell is less than a reference value. Such conditions may be required for a stable operation of an ESS system.

The differential data calculating unit 220 may calculate the differential data by using sampling with respect to voltage data measured through the sensing unit 210. Herein, sampling with respect to the voltage data may mean a pre-processing process of converting the voltage of the battery cell into data in a monotonically increasing or monotonically decreasing form. For example, the differential data calculating unit 220 may perform sampling with respect to the voltage, by classifying capacity values Q of the battery cell, which have an equal voltage magnitude V, and calculating an average value of the capacity values of the battery cell for each voltage magnitude.

In addition, the differential data calculating unit 220 may calculate the differential data by using a smoothing spline for the voltage data measured through the sensing unit 210. In this way, through conversion to satisfy continuity between adjacent data, a curve of the differential data of the battery cell may be converted into a gentle form.

The abnormality diagnosing unit 230 may diagnose abnormality of the battery cell based on the differential data and classify a type of the abnormality. The abnormality diagnosing unit 230 may classify a type of the abnormality of the battery cell based on a peak value of the differential data. Moreover, the abnormality diagnosing unit 230 may classify the type of the abnormality of the battery cell based on a voltage at a peak of the differential data and an intensity of the peak of the differential data.

More specifically, the abnormality diagnosing unit 230 may classify abnormality of the battery cell as a first type for the abnormality of the battery cell classify a first type for abnormality of the battery cell by comparing a sum of voltages at the peak of the differential data with a preset first reference value. In this case, the first reference value may be expressed as a sum of an average and a standard deviation for the differential data (e.g., $\mu+3\sigma$). For example, the first type for abnormality of the battery cell may include an available-lithium loss.

Furthermore, the abnormality diagnosing unit 230 may classify abnormality of the battery cell as a second type for the abnormality of the battery cell by comparing a sum of intensities of peaks of the differential data with a preset second reference value. In this case, the second reference value may be expressed as a difference between the average and the standard deviation (e.g., $\mu-3\sigma$). For example, the second type for abnormality of the battery cell may include anodic reaction area reduction.

The abnormality diagnosing unit 230 may classify abnormality of the battery cell as a third type for the abnormality of the battery cell by comparing a value, obtained by dividing an intensity of a peak of the differential data by a voltage at the peak of the differential data, with a preset third reference value. In this case, the third reference value may be expressed as a sum of the average and the standard deviation for the differential data (e.g., $\mu+3\sigma$). For example, the third type for abnormality of the battery cell may include cathodic reaction area reduction.

Meanwhile, although not shown in FIG. 2, the battery abnormality diagnosis apparatus 200 according to an embodiment of the present invention may include a storing unit. The storing unit may store voltage and current measurement data of the battery cell, differential data for the capacity and voltage of the battery cell, various data regarding an abnormality type of the battery cell, and the like. However, the storing unit is not necessarily included in the battery abnormality diagnosis apparatus 200, and the storing unit may be included in an external server and transmit and receive data through a separate communication module (not shown).

The battery abnormality diagnosis apparatus 200 according to an embodiment of the present invention may further include a display unit. Thus, the battery abnormality diagnosis apparatus 200 according to an embodiment of the present invention may express a differential curve general shape, etc., calculated through the differential data calculating unit 220, in the form of a graph to a user through the display unit. In addition, the display unit may include a user interface (e.g., a touch pad, etc.) to receive a user's input.

As such, according to the battery abnormality diagnosis apparatus and method of the present invention, by analyzing differential data for a capacity and a voltage of a battery, an abnormal behavior of the battery may be diagnosed and an abnormality type may be classified.

Figure 3:
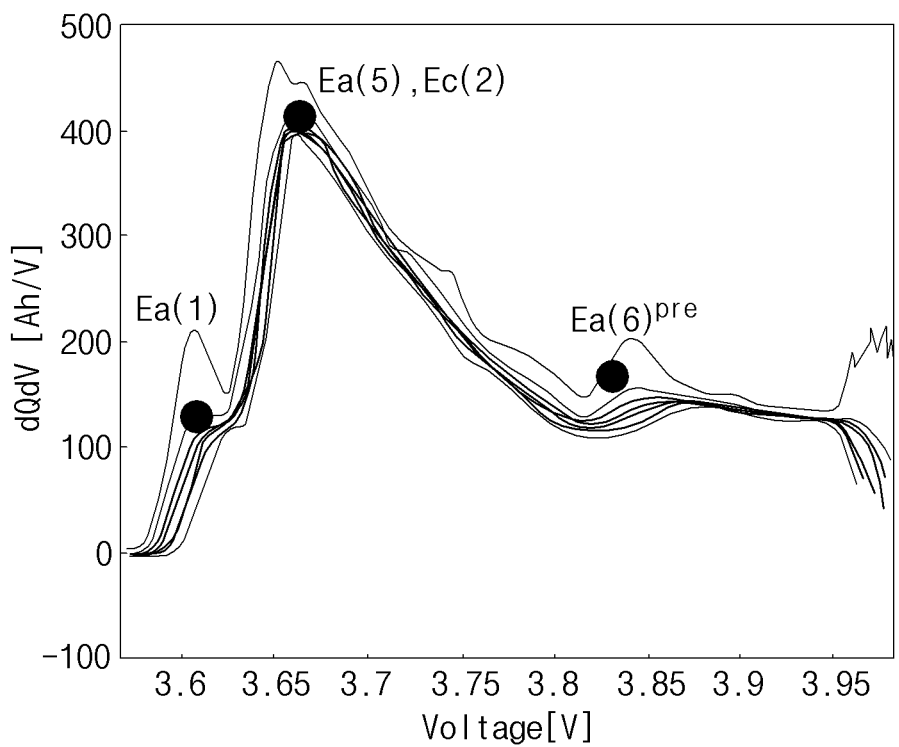
FIG. 3 is a graph showing a general shape of differential data calculated by a battery abnormality diagnosis apparatus according to an embodiment of the present invention.

FIG. 3 is a graph showing a general shape of differential data calculated by a battery abnormality diagnosis apparatus according to an embodiment of the present invention. Referring to FIG. 3, an x axis may indicate a voltage V of a battery cell, and a y axis may indicate differential data dQ/dV (Ah/V) regarding a capacity and a voltage of the battery cell.

As shown in FIG. 3, the battery abnormality diagnosis apparatus according to an embodiment of the present invention may determine abnormality of the battery cell by analyzing a general shape of the differential data for the capacity and the voltage of the battery cell. For example, abnormality may occur in the battery cell in parts of a differential curve of FIG. 3 where peaks appear, like points Ea(1), Ea(5), Ec(2), and Ea(6)$^{pre}$.

Moreover, by applying a statistical method to the differential data of FIG. 3, abnormality of the battery cell may be diagnosed. For example, a statistical value such as an average, a standard deviation, etc., for the differential data of the battery cell may be compared with a preset threshold value, thereby detecting abnormality of the battery cell. In this case, by using an analysis scheme such as a sliding window for the average, the standard deviation, etc., abnormality may be diagnosed.

FIG. 4A is a view showing maximum peak voltage and peak intensity calculated by a battery abnormality diagnosis apparatus according to an embodiment of the present invention.

Referring to FIG. 4A, in an upper graph, an x axis indicates time and a y axis indicates a voltage V (e.g., the x axis of FIG. 3) where a maximum peak appears in the differential data of FIG. 3. In a lower graph of FIG. 4A, an x axis indicates time and a y axis indicates an intensity (Ah/V) of a maximum peak in the differential data of FIG. 3. In this case, data of FIG. 4A, which is obtained for a charging/discharging time of the battery cell, may correspond to Ea(5) and Ec(2) of FIG. 3.

Referring to the upper graph and the lower graph of FIG. 4A, the general shape of the maximum peak voltage and the maximum peak intensity of the battery cell has a peak that falls within a specific range and then leaves an upper end or a lower end during a specific period. For example, it may be seen from FIG. 4A that peaks are generated in common in the upper graph and the lower graph on Dec. 2, Dec. 10, and Dec. 26, 2019. Thus, the battery abnormality diagnosis apparatus according to an embodiment of the present invention may determine abnormality of the battery cell by detecting a peak value in a curve of a maximum peak voltage and a maximum peak intensity of the battery cell.

Figure 4B:
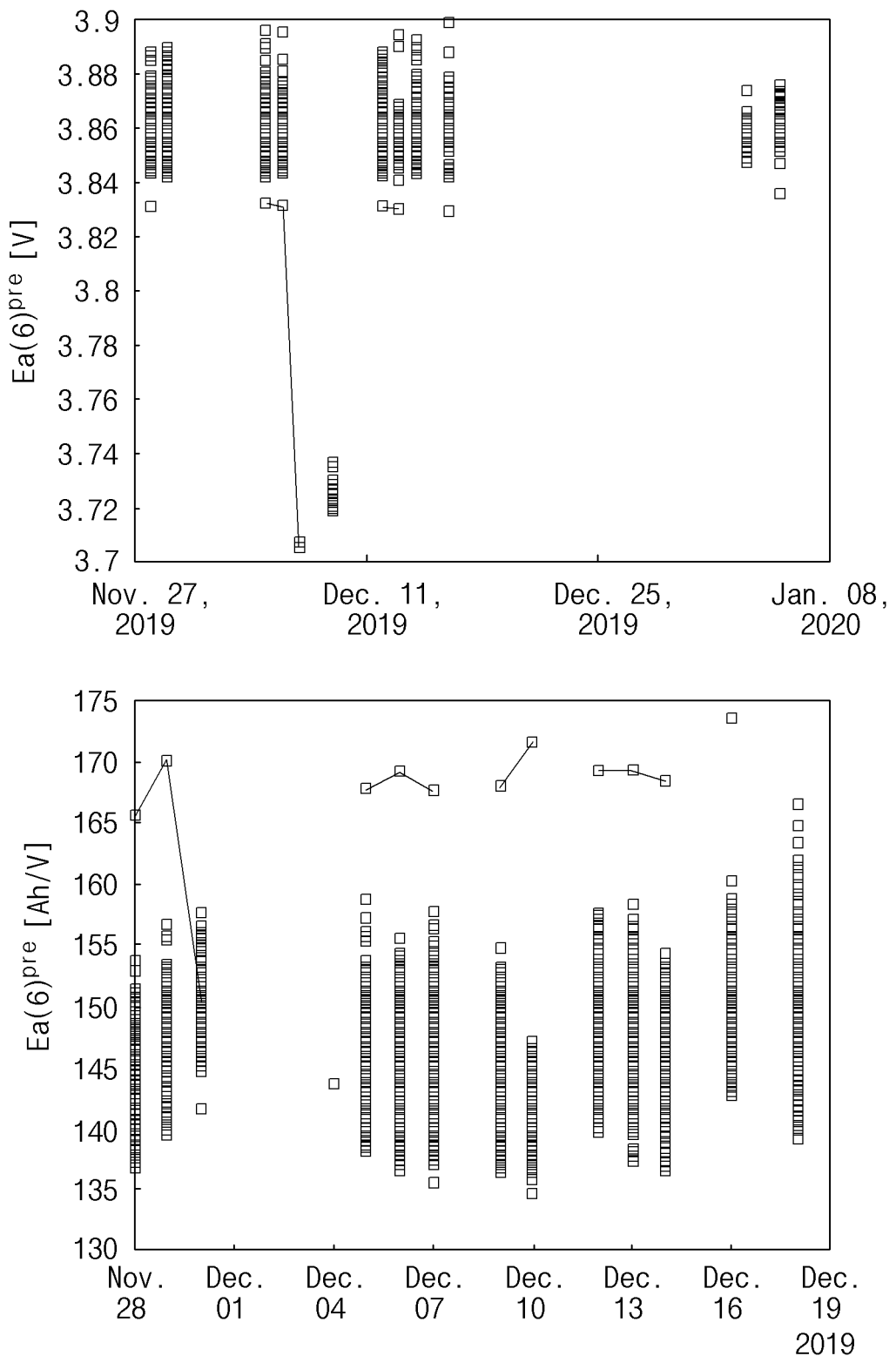
FIG. 4B is a view showing a peak voltage and a peak intensity at a specific point in charging, calculated by a battery abnormality diagnosis apparatus, according to an embodiment of the present invention.

FIG. 4B is a view showing a peak voltage and a peak intensity at a specific point in charging, calculated by a battery abnormality diagnosis apparatus according to an embodiment of the present invention.

Referring to FIG. 4B, in an upper graph, an x axis indicates time and a y axis indicates a voltage V (e.g., the x axis of FIG. 3) where a maximum peak appears in the differential data of FIG. 3. In a lower graph of FIG. 4A, an x axis indicates time and a y axis indicates an intensity (Ah/V) of a maximum peak in the differential data of FIG. 3. In this case, data of FIG. 4B, which is obtained for a charging/discharging time of the battery cell, may correspond to Ea(6)$^{pre}$ of FIG. 3.

Referring to an upper graph and a lower graph of FIG. 4B, like in the case of FIG. 4A, the general shape of the maximum peak voltage and the maximum peak intensity of the battery cell has data that falls within a specific range and then leaves an upper end or a lower end during a specific period. For example, abnormal data is generated on Dec. 5, 2019 in the upper graph of FIG. 4B, and abnormal data is generated on December 5, December 10, and December 13 in the lower graph. Thus, the battery abnormality diagnosis apparatus according to an embodiment of the present invention may determine abnormality of the battery cell by detecting abnormal data deviating from a preset range from the curve of the maximum peak voltage and the maximum peak intensity of the battery cell.

Figure 5:
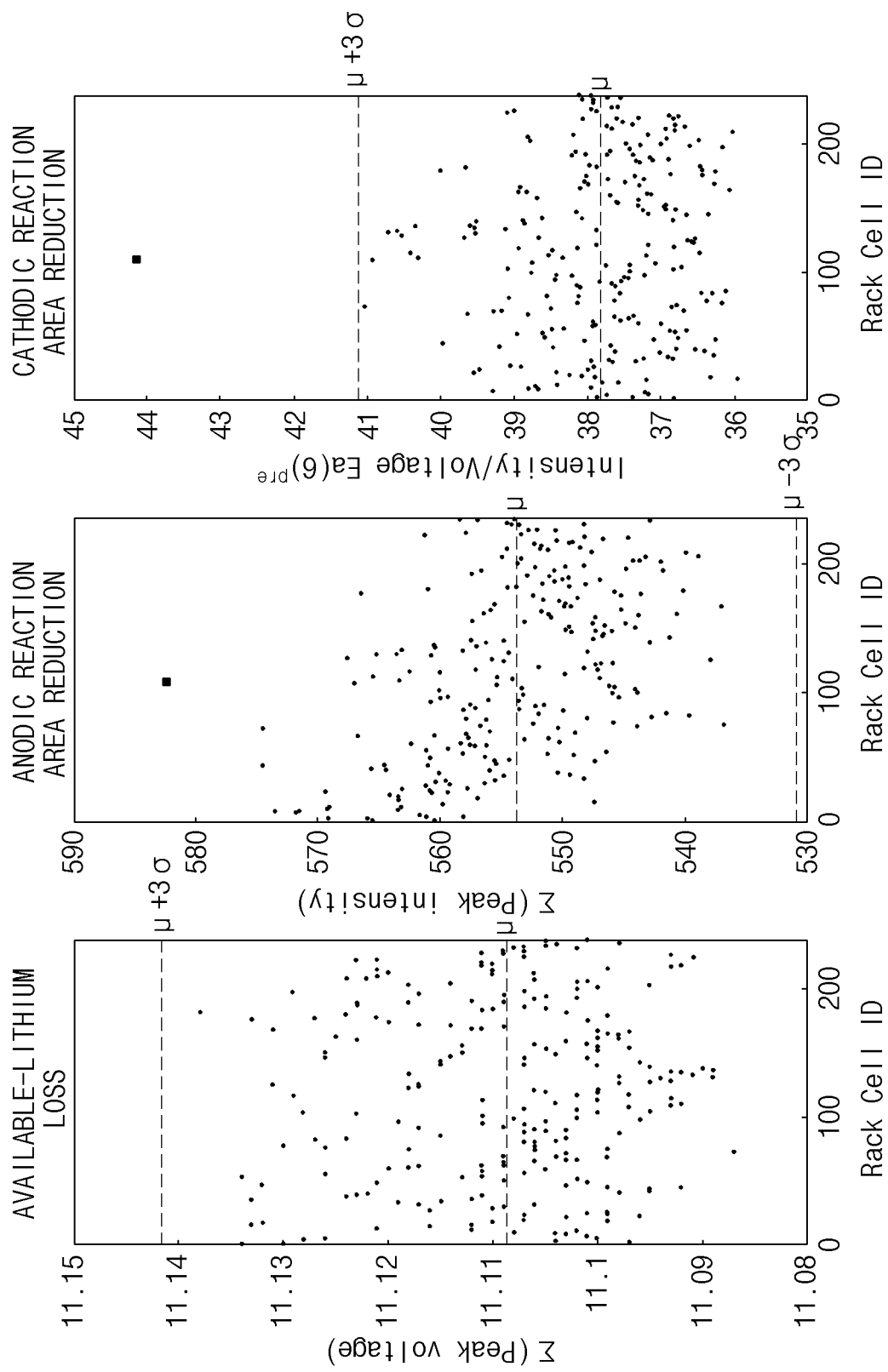
FIG. 5 is a view showing an abnormality type classified by a battery abnormality diagnosis apparatus according to an embodiment of the present invention.

FIG. 5 is a view showing an abnormality type classified by a battery abnormality diagnosis apparatus according to an embodiment of the present invention.

Referring to FIG. 5, an x axis indicates an ID of a battery cell included in a battery rack, and a y axis indicates a sum of peak voltages at which a peak of differential data appears, a sum of intensities of peaks, and a value obtained by dividing an intensity of a peak by a voltage (e.g., $Ea(6)^{pre}$ of FIG. 3), respectively, sequentially in order from the left graph.

As such, as shown in FIG. 5, the battery abnormality diagnosis apparatus according to an embodiment of the present invention may diagnose abnormality of the battery cell based on values calculated from the differential data and classify a type of the abnormality.

More specifically, referring to the first graph of FIG. 5, when a sum of voltages at peaks of the differential data is greater than a first reference value (e.g., $\mu+3\sigma$), abnormality of the battery cell may be classified as the first type for the abnormality of the battery cell. In this case, the first type may be an available-lithium loss.

In addition, referring to the second graph of FIG. 5, when a sum of peak intensities of the differential data is less than a preset second reference value (e.g., $\mu-3\sigma$), abnormality of the battery cell may be classified as the second type for the abnormality of the battery cell. In this case, the second type may be anodic reaction area reduction.

Moreover, referring to the third graph of FIG. 5, when a value obtained by dividing a peak intensity of the differential data by a voltage at a peak of the differential data is greater than a preset third reference value (e.g., $\mu+3\sigma$), abnormality of the battery cell may be classified as the third type for the abnormality of the battery cell. In this case, the third type may be cathodic reaction area reduction.

Meanwhile, it has been described with reference to FIG. 5 that the first through third types for abnormality of the battery cell indicate the available-lithium loss, the anodic reaction area reduction, the cathodic reaction area reduction, respectively, the present invention is not limited thereto and an abnormality type detectable by the battery abnormality diagnosis apparatus according to the present invention may be included variously.

In addition, it has been described with reference to FIG. 5 that a sum of voltages at peaks of the differential data, a sum of peak intensities of the differential data, and a value obtained by dividing a peak intensity of the differential data by a voltage at a peak of the differential data are compared with reference values, the present invention is not limited thereto such that other calculated values derived from the differential data than the above-described calculated values may be used and various diagnosis schemes may be used depending on a need. While reference values have been set based on a sum of an average and a standard deviation for the differential data of the battery cell or a difference therebetween, the first through third reference values may be set variously depending on a need.

Figure 6:
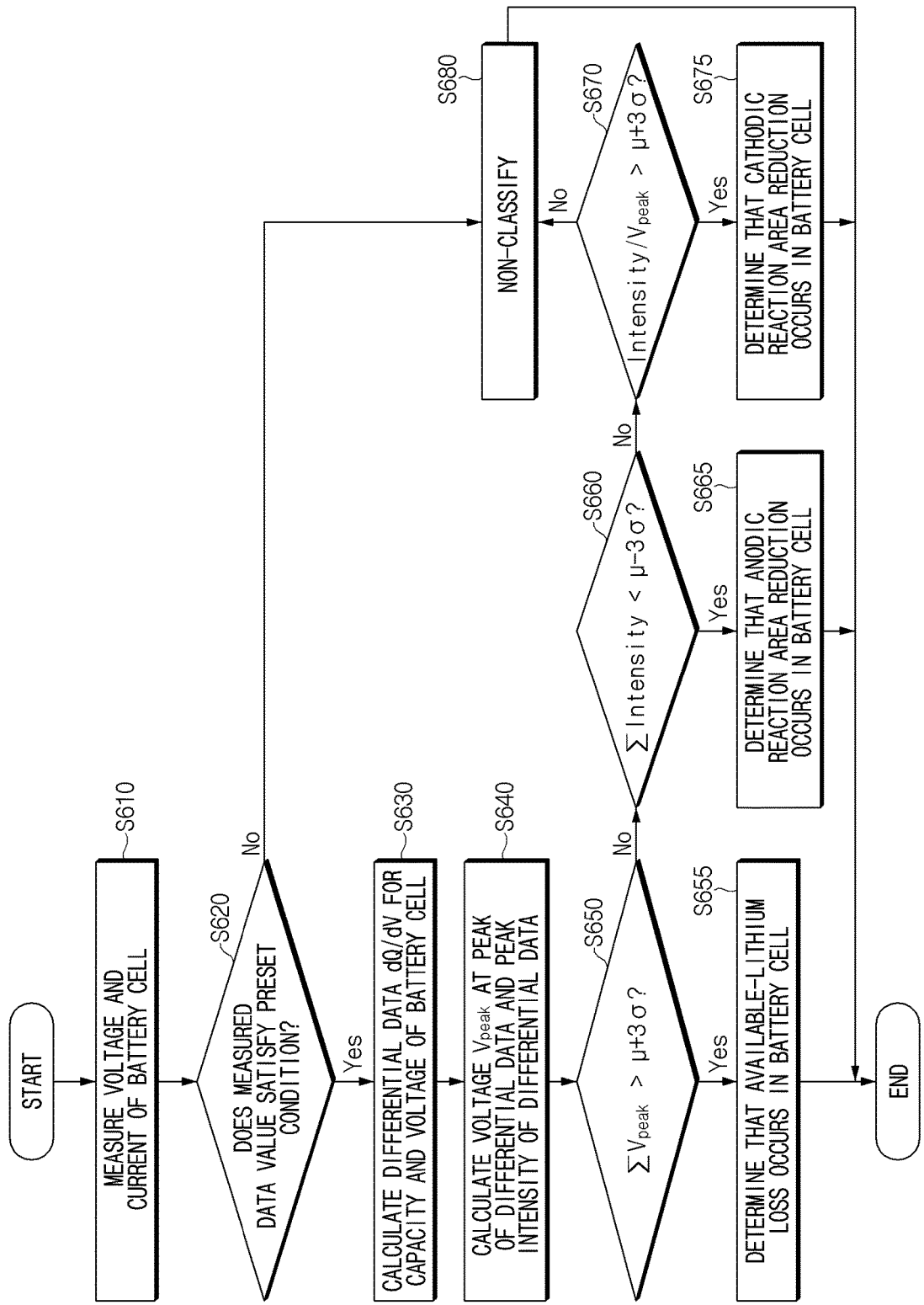
FIG. 6 is a flowchart showing a battery abnormality diagnosis method according to an embodiment of the present invention.

FIG. 6 is a flowchart showing a battery abnormality diagnosis method according to an embodiment of the present invention.

Referring to FIG. 6, a voltage and a current of a battery cell may be measured in operation S610. In this case, in operation S610, the voltage and the current of the battery cell may be measured at preset specific time intervals.

It is also determined in operation S620 whether measurement data values satisfy a preset condition. Herein, the preset condition may include a case where a charging current change or a discharging current change of the battery cell for a specific time is greater than a reference value and an SOC change for a specific time after end of charging/discharging of the battery cell is less than a reference value. This condition may be required for a stable operation of an ESS system.

When the measurement data value does not satisfy the preset condition (NO), non-classification processing may be performed in operation S680. On the other hand, when the measurement data value satisfies a preset condition (YES), operation S630 may be performed.

In operation S630, the differential data dQ/dV for the capacity and the voltage of the battery cell may be calculated. In this case, by using sampling with respect to measured voltage data, the differential data may be calculated. For example, sampling with respect to a voltage may be performed by classifying capacity values having an equal voltage magnitude of the battery cell and calculating an average value of the capacity values of the battery cell for each voltage magnitude, such that the voltage of the battery cell may be converted into data in a monotonically increasing or monotonically decreasing form. In operation S630, through conversion using a smoothing spline with respect to the measured voltage data to satisfy continuity between adjacent data, the curve of the differential data of the battery cell may be converted into a gentle form.

Next, a voltage $V_{peak}$ at a peak of the differential data and an intensity Intensity of the peak of the differential data may be calculated, in operation S640. In operation S650, a sum, $\Sigma^{V_{peak}}$, of voltages at a peak of the differential data may be compared with a preset first reference value ($\mu+3\sigma$). When the sum of the voltages at the peak of the differential data exceeds the first reference value (YES), it is determined in operation S655 that an available-lithium loss occurs in the battery cell.

On the other hand, when the sum of the voltages at the peak of the differential data is less than or equal to a second reference value (NO), a sum, $\Sigma$Intensity, of peak intensities of the differential data may be compared with a preset second reference value ($\mu-3\sigma$) in operation S660. When the sum of the peak intensities of the differential data is less than the second reference value (YES), it is determined in operation S665 that anodic reaction area reduction occurs in the battery cell.

On the other hand, when the sum of the peak intensities of the differential data is greater than or equal to the second reference value (NO), a value, Intensity/$V_{peak}$, obtained by dividing a peak intensity of the differential data by a voltage at the peak of the differential data may be compared with a preset third reference value ($\mu+3\sigma$) in operation S670. When the sum of the peak intensities of the differential data is greater than the third reference value (YES), it is determined in operation S675 that cathodic reaction area reduction occurs in the battery cell.

Meanwhile, when the sum of the peak intensities of the differential data is less than the third reference value (NO), the process may end without classifying a type of abnormality of the battery cell, in operation S680.

As such, according to the battery abnormality diagnosis method of the present invention, by analyzing differential data for a capacity and a voltage of a battery, an abnormal behavior of the battery may be diagnosed and an abnormality type may be classified.

Figure 7:
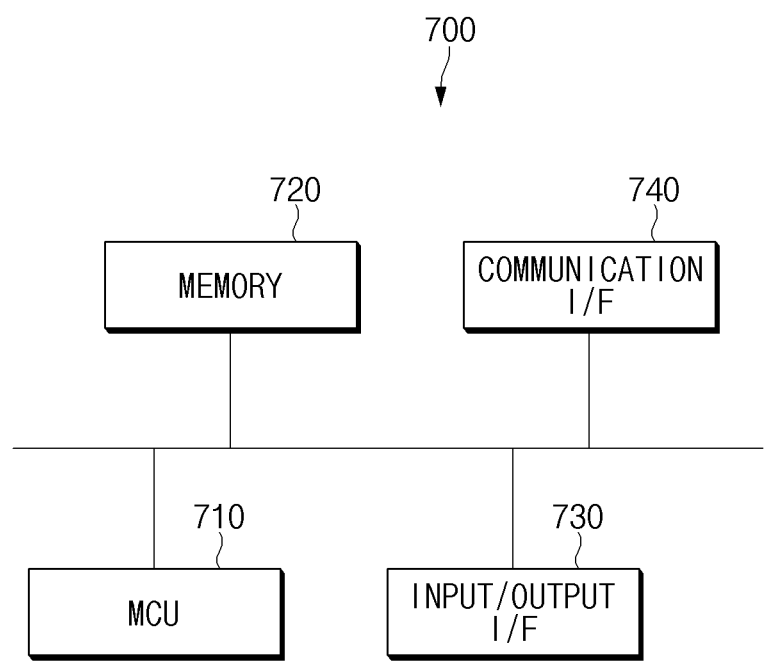
FIG. 7 is a block diagram showing a hardware structure of a battery abnormality diagnosis apparatus according to an embodiment of the present invention.

FIG. 7 is a block diagram showing a hardware structure of a battery abnormality diagnosis apparatus according to an embodiment of the present invention.

Referring to FIG. 7, a battery abnormality diagnosis apparatus 700 according to an embodiment of the present invention may include a microcontroller unit (MCU) 710, a memory 720, an input/output interface (I/F) 730, and a communication I/F 740.

The MCU 710 may be a processor that executes various programs (e.g., a battery diagnosis program, a differential data calculation program, a battery abnormality type classification program, etc.) stored in the memory 720, processes various data for abnormality diagnosis, type classification, etc., of the battery cell through these programs, and executes the above-described functions of FIG. 2.

The memory 720 may store various programs regarding differential data calculation, abnormality diagnosis and classification, etc., of the battery cell. Moreover, the memory 720 may store various data such as measured voltage and current data of the battery cell, differential data of the battery cell, etc.

The memory 720 may be provided in plural, depending on a need. The memory 720 may be a volatile or nonvolatile memory. For the memory 720 as the volatile memory, random access memory (RAM), dynamic RAM (DRAM), static RAM (SRAM), etc., may be used. For the memory 720 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 720 are merely examples and are not limited thereto.

The input/output I/F 730 may provide an interface for transmitting and receiving data by connecting an input device (not shown) such as a keyboard, a mouse, a touch panel, etc., and an output device such as a display (not shown), etc., with the MCU 710.

The communication I/F 740, which is a component capable of transmitting and receiving various data to and from a server, may be various types of devices capable of supporting wired or wireless communication. For example, a program for differential data calculation and diagnosis of the battery cell or various data may be transmitted and received to and from a separately provided external server through the communication I/F 740.

As such, a computer program according to an embodiment of the present invention may be recorded in the memory 720 and processed by the MCU 710, thus being implemented as a module that performs function blocks shown in FIG. 2.

Even though all components constituting an embodiment of the present invention have been described above as being combined into one or operating in combination, the present invention is not necessarily limited to the embodiment. That is, within the object scope of the present invention, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present invention.

The above description is merely illustrative of the technical idea of the present invention, and various modifications and variations will be possible without departing from the essential characteristics of the present invention by those of ordinary skill in the art to which the present invention pertains. Therefore, the embodiments disclosed in the present invention are intended for description rather than limitation of the technical spirit of the present invention, and the scope of the technical spirit of the present invention is not limited by these embodiments. The protection scope of the present invention should be interpreted by the following claims, and all technical spirits within the same range should be understood to be included in the range of the present invention.

The invention claimed is:

1. A battery abnormality diagnosis apparatus, comprising:
at least one processor; and
at least one memory configured to store at least one program, when executed by the at least one processor, causing the at least one processor to:
calculate differential data of a battery cell based on a voltage of the battery cell, the differential data representing a capacity of the battery cell differentiated by the voltage of the battery cell;
diagnose abnormality of the battery cell based on at least one peak of the differential data; and
classify a type of the abnormality based on at least one voltage at the at least one peak of the differential data and at least one peak intensity at the at least one peak of the differential data,
wherein the classifying the type of the abnormality comprises one of:
comparing a sum of the at least one voltage at the at least one peak of the differential data with a first preset reference value, or
comparing a sum of the at least one peak intensity at the at least one peak of the differential data with a second preset reference value, or
comparing a value obtained by dividing the at least one peak intensity of the differential data by the at least one voltage at the at least one peak of the differential data with a third preset reference value.

2. The battery abnormality diagnosis apparatus of claim 1, wherein the type of the abnormality is classified as a first type of abnormality when the sum of the at least one voltage at the at least one peak of the differential data is greater than the first preset reference value, and
wherein the first type of abnormality comprises an available-lithium loss.

3. The battery abnormality diagnosis apparatus of claim 1, wherein the type of the abnormality is classified as a second type of abnormality when the sum of the at least one peak intensity at the at least one peak of the differential data is less than the second preset reference value, and
wherein the second type of abnormality comprises an anodic reaction area reduction.

4. The battery abnormality diagnosis apparatus of claim 1, wherein the type of the abnormality is classified as a third type of abnormality when the value obtained by dividing the at least one peak intensity of the differential data by the at least one voltage is greater than the third preset reference value, and
wherein the third type of abnormality comprises a cathodic reaction area reduction.

5. The battery abnormality diagnosis apparatus of claim 1, wherein the at least one program, when executed by the at least one processor, causes the at least one processor to calculate the differential data of the battery cell when a charging current change or a discharging current change of the battery cell for a specific time is greater than a reference value.

6. The battery abnormality diagnosis apparatus of claim 1, wherein the at least one program, when executed by the at least one processor, causes the at least one processor to calculate the differential data of the battery cell when a state of charge (SOC) change for a reference time after an end of charging/discharging of the battery cell is less than a reference value.

7. The battery abnormality diagnosis apparatus of claim 1, wherein the at least one program, when executed by the at least one processor, causes the at least one processor to calculate the differential data of the battery cell by sampling the voltage of the battery cell.

8. The battery abnormality diagnosis apparatus of claim 1, wherein the at least one program, when executed by the at least one processor, causes the at least one processor to calculate the differential data of the battery cell by using a smoothing spline with respect to the voltage of the battery cell.

9. A battery abnormality diagnosis method comprising:
calculating differential data of a battery cell based on a voltage of the battery cell, the differential data representing a capacity of the battery cell differentiated by the voltage of the battery cell;
diagnosing abnormality of the battery cell based on at least one peak of the differential data; and
classifying a type of the abnormality based on at least one voltage at the at least one peak of the differential data and at least one peak intensity at the at least one peak of the differential data,
wherein the classifying the type of the abnormality comprises one of:
comparing a sum of the at least one voltage at the at least one peak of the differential data with a first preset reference value, or
comparing a sum of the at least one peak intensity at the at least one peak of the differential data with a second preset reference value, or
comparing a value obtained by dividing the at least one peak intensity of the differential data by the at least one voltage at the at least one peak of the differential data with a third preset reference value.

10. The battery abnormality diagnosis method of claim 9, wherein the type of the abnormality is classified as a first type of abnormality when the sum of the at least one voltage at the at least one peak of the differential data is greater than the first preset reference value, and
wherein the first type of abnormality comprises an available-lithium loss.

11. The battery abnormality diagnosis method of claim 9, wherein the type of the abnormality is classified as a second type of abnormality when the sum of the at least one peak intensity at the at least one peak of the differential data is less than the second preset reference value, and
wherein the second type of abnormality comprises an anodic reaction area reduction.

12. The battery abnormality diagnosis method of claim 9, wherein the type of the abnormality is classified as a third type of abnormality when the value obtained by dividing the at least one peak intensity of the differential data by the at least one voltage is greater than the third preset reference value, and
wherein the third type of abnormality comprises a cathodic reaction area reduction.

* * * * *